US011740287B2

(12) United States Patent
Ooigawa et al.

(10) Patent No.: US 11,740,287 B2
(45) Date of Patent: Aug. 29, 2023

(54) SEMICONDUCTOR DEVICE AND SEMICONDUCTOR DEVICE EXAMINATION METHOD

(71) Applicant: Kioxia Corporation, Tokyo (JP)

(72) Inventors: Isao Ooigawa, Kawasaki Kanagawa (JP); Nariyuki Fukuda, Yokohama Kanagawa (JP); Kazuhito Hosaka, Kawasaki Kanagawa (JP); Tsutomu Miyamae, Yokohama Kanagawa (JP); Takeshi Yamaguchi, Kamakura Kanagawa (JP); Suguru Tahara, Yokohama Kanagawa (JP); Keitarou Mishima, Yokohama Kanagawa (JP); Yuichiro Sanuki, Urayasu Chiba (JP); Koichi Kimura, Yokohama Kanagawa (JP)

(73) Assignee: Kioxia Corporation, Toyko (JP)

( * ) Notice: Subject to any disclaimer, the term of this patent is extended or adjusted under 35 U.S.C. 154(b) by 0 days.

(21) Appl. No.: 17/690,443

(22) Filed: Mar. 9, 2022

(65) Prior Publication Data

US 2023/0079823 A1 Mar. 16, 2023

(30) Foreign Application Priority Data

Sep. 10, 2021 (JP) .................. 2021-147753

(51) Int. Cl.
*G01R 31/3185* (2006.01)
(52) U.S. Cl.
CPC ............... *G01R 31/318536* (2013.01); *G01R 31/318541* (2013.01); *G01R 31/318552* (2013.01); *G01R 31/318555* (2013.01)

(58) Field of Classification Search
CPC .... G01R 31/318536; G01R 31/318552; G01R 31/318555; G01R 31/318541
USPC ......................................... 714/731, 726, 729
See application file for complete search history.

(56) References Cited

U.S. PATENT DOCUMENTS

| 10,401,430 B2 | 9/2019 | Maekawa | |
|---|---|---|---|
| 2003/0197541 A1* | 10/2003 | Campbell | G01R 31/318552 327/295 |
| 2006/0026473 A1* | 2/2006 | Patrick Tan | G01R 31/318541 714/726 |
| 2009/0240997 A1* | 9/2009 | Hasegawa | G01R 31/31727 714/E11.155 |

(Continued)

FOREIGN PATENT DOCUMENTS

| JP | 2010-032428 A | 2/2010 |
|---|---|---|
| JP | 6878071 B2 | 5/2021 |

*Primary Examiner* — John J Tabone, Jr.
(74) *Attorney, Agent, or Firm* — Foley & Lardner LLP

(57) ABSTRACT

A semiconductor device of the embodiment includes a plurality of scan chains, a shift clock control circuit, and a shift clock generation circuit. The plurality of scan chains each include a plurality of scan flip-flops. The shift clock control circuit outputs, to each of the plurality of scan chains, a control signal that non-inverts or inverts a scan clock signal. The shift clock generation circuit is provided to each of the plurality of scan flip-flops and generates a non-inverted scan clock signal or an inverted scan clock signal based on the control signal, the non-inverted scan clock signal being obtained by non-inverting the scan clock signal, the inverted scan clock signal being obtained by inverting the scan clock signal.

7 Claims, 5 Drawing Sheets

(56) References Cited

U.S. PATENT DOCUMENTS

| | | | | |
|---|---|---|---|---|
| 2010/0318862 A1* | 12/2010 | Niiyama | ........ | G01R 31/318552 |
| | | | | 714/E11.155 |
| 2015/0212150 A1* | 7/2015 | Mittal | ............ | G01R 31/318552 |
| | | | | 714/727 |
| 2023/0079823 A1* | 3/2023 | Ooigawa | ........ | G01R 31/318536 |
| | | | | 714/731 |

* cited by examiner

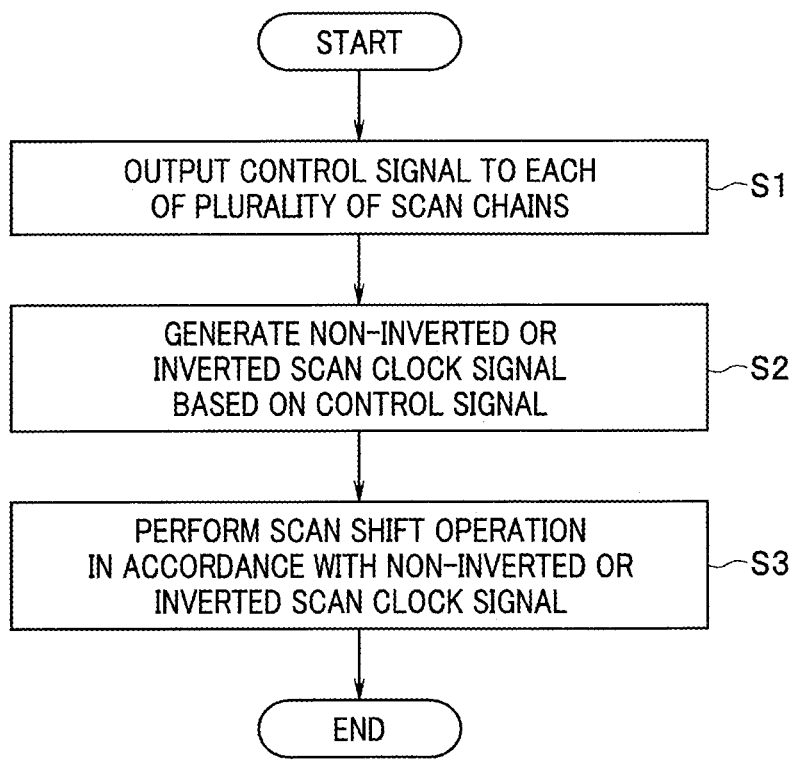

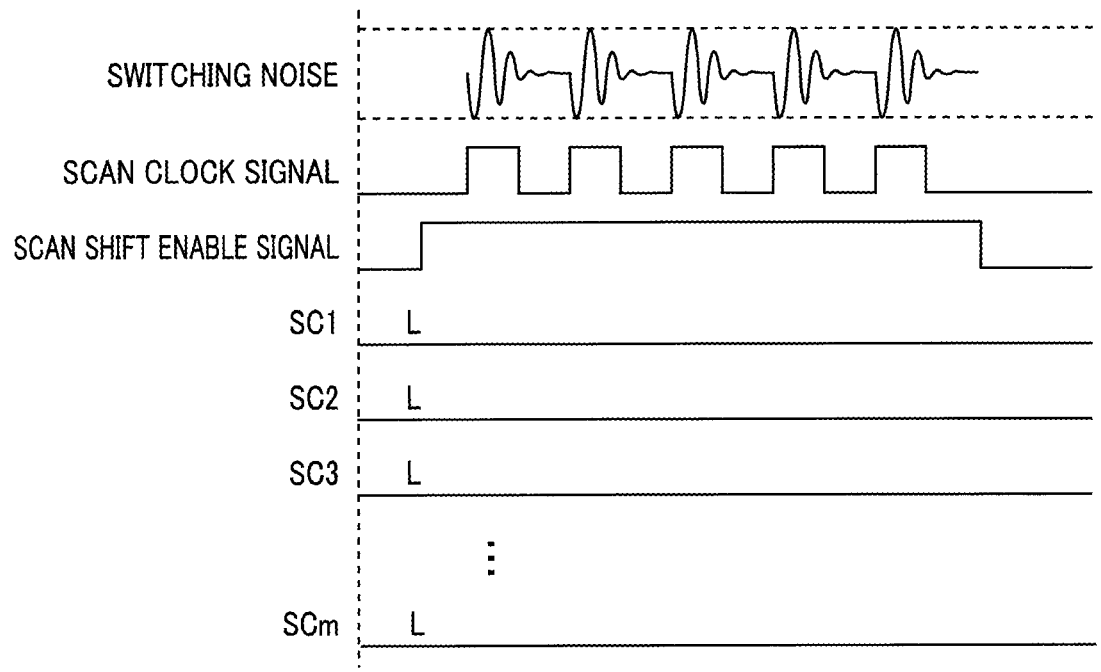
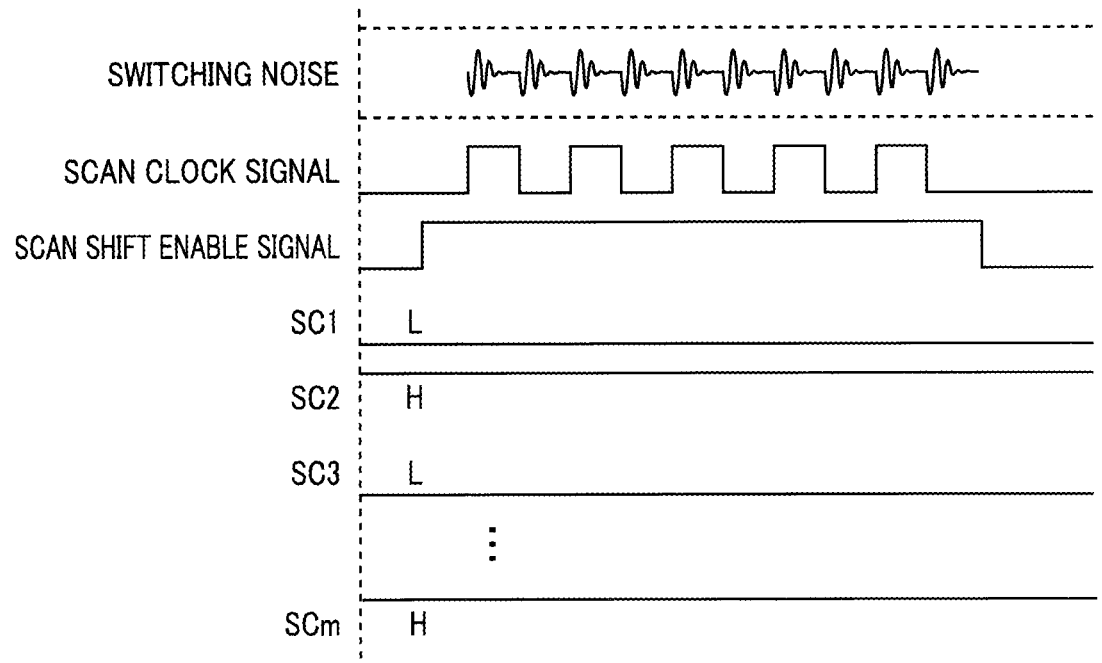

SEMICONDUCTOR DEVICE AND SEMICONDUCTOR DEVICE EXAMINATION METHOD

CROSS-REFERENCE TO RELATED APPLICATIONS

This application is based upon and claims the benefit of priority from the prior Japanese Patent Application No. 2021-147753 filed on Sep. 10, 2021; the entire contents of which are incorporated herein by reference.

FIELD

The present embodiment relates to a semiconductor device and a semiconductor device examination method.

BACKGROUND

A scan test using a scan circuit is known as one of semiconductor device examination methods. In the scan circuit, flip-flops (hereinafter referred to as FFs) in the circuit are replaced with scan FFs and a scan chain is configured by serially connecting the scan FFs.

In the scan test using the scan circuit, since all the scan FFs under test are simultaneously switched during scan shift operation, influence of switching noise becomes large.

A possible way to reduce the influence of switching noise is to decrease the number of scan data that transition simultaneously. This method however increases the test time period as the number of scan patterns increases.

BRIEF DESCRIPTION OF THE DRAWINGS

FIG. 5 is a flowchart illustrating an example of a process of semiconductor device examination;

FIG. 6 is a waveform diagram illustrating a waveform of switching noise when all scan FFs are simultaneously switched; and FIG. 7 is a waveform diagram illustrating a waveform of switching noise when a ratio of simultaneously switched scan FFs is controlled.

DETAILED DESCRIPTION

A semiconductor device of the present embodiment includes a plurality of scan chains, a shift clock control circuit, and a shift clock generation circuit. The plurality of scan chains each include a plurality of scan flip-flops. The shift clock control circuit outputs, to each of the plurality of scan chains, a control signal that non-inverts or inverts a scan clock signal. The shift clock generation circuit is provided to each of the plurality of scan flip-flops and generates a non-inverted scan clock signal or an inverted scan clock signal based on the control signal, the non-inverted scan clock signal being obtained by non-inverting the scan clock signal, the inverted scan clock signal being obtained by inverting the scan clock signal.

An embodiment will be described below with reference to the accompanying drawings.

Figure 1:
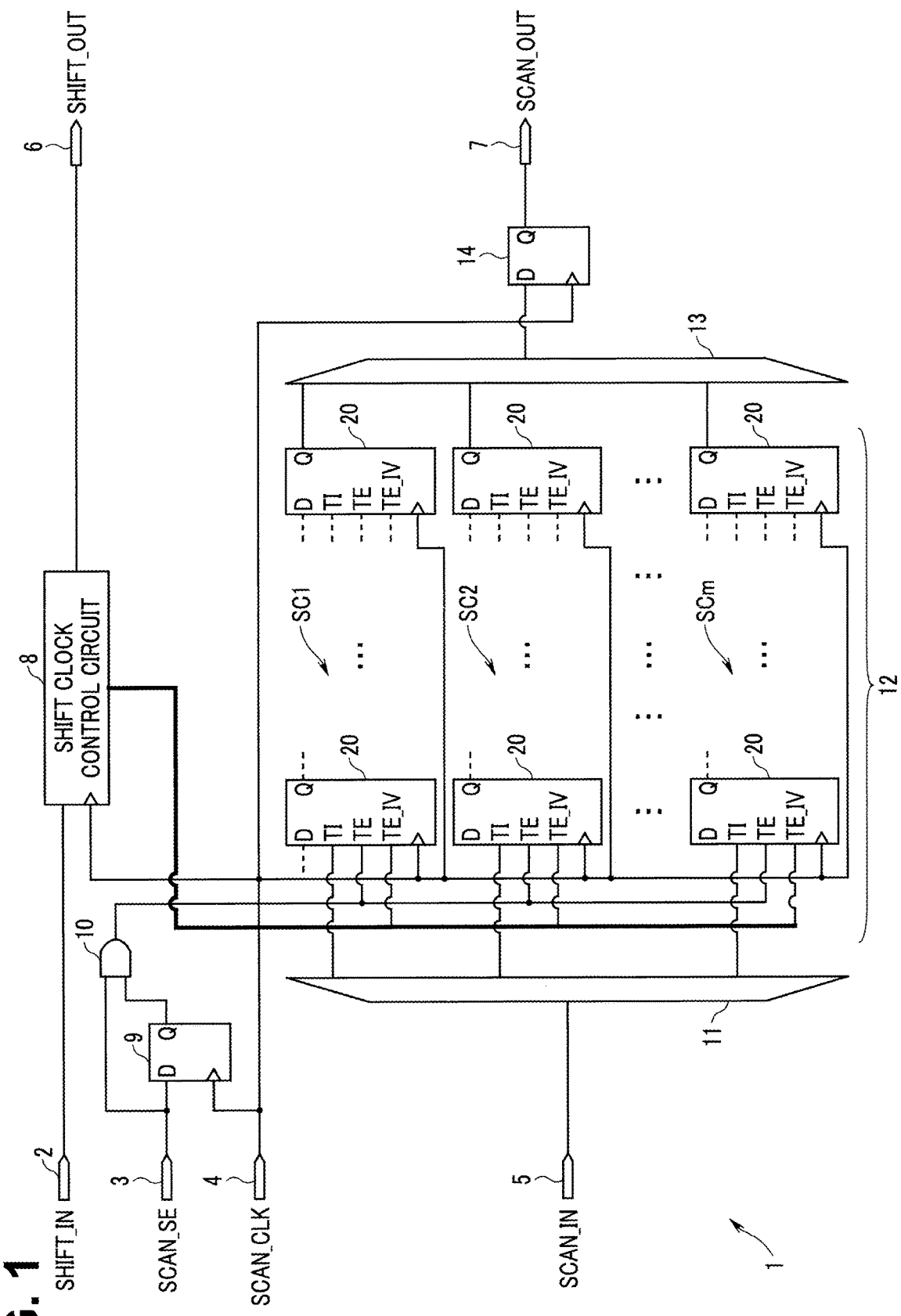
FIG. 1 is a block diagram illustrating an example of a configuration of a semiconductor device according to an embodiment.

FIG. 1 is a block diagram illustrating an example of a configuration of a semiconductor device according to the embodiment.

The semiconductor device 1 of the present embodiment includes a shift-in terminal 2, a scan shift enable terminal 3, a scan clock terminal 4, a scan-in terminal 5, a shift-out terminal 6, a scan-out terminal 7, a shift clock control circuit 8, an FF 9, an AND circuit 10, a decompressor 11, a scan chain 12, a compressor 13, and an FF 14. The semiconductor device 1 is subjected to a scan test by an examination device such as a large-scale tester.

The scan chain 12 includes a plurality of scan chains SC1, SC2, . . . , SCm. Note that any one scan chain or every scan chain among the plurality of scan chains SC1 to SCm is also referred to as a scan chain SC. The scan chain SC is configured as a shift register by serially connecting a plurality of scan FFs 20 in the semiconductor device 1. Note that the number of scan chains SC may be two or more.

The shift clock control circuit 8 supplies, in accordance with shift-in data input through the shift-in terminal 2, a control signal for controlling non-inversion/inversion of a scan clock to a TE_IV terminal of each scan FF 20 of the scan chain SC.

A scan shift enable signal is input from the scan shift enable terminal 3 to the FF 9. The FF 9 holds a state of the scan shift enable signal at a rising edge of a scan clock signal and outputs the scan shift enable signal to the AND circuit 10.

The AND circuit 10 performs AND calculation of the scan shift enable signal input from the scan shift enable terminal 3 and a signal output from the FF 9, and supplies a test enable signal as a result of the calculation to a TE terminal of each scan FF 20 of the scan chain SC. In other words, the AND circuit 10 synchronizes the scan shift enable signal with the scan clock signal and supplies the synchronized signal as a test enable signal to each scan FF 20 of the scan chain SC.

A compressed test pattern is input from the examination device to the decompressor 11 through the scan-in terminal 5. The decompressor 11 decompresses (expands) the compressed test pattern and supplies the decompressed test pattern to a TI terminal of a leading scan FF 20 of each of the scan chains SC1 to SCm. The scan chains SC1 to SCm perform scan shift operation in accordance with the non-inverted or inverted scan clock signal as described later.

The compressor 13 compresses data output from the scan chains SC1 to SCm and outputs the compressed data to the FF 14. The FF 14 sequentially acquires the data output from the compressor 13 at every rising edge of the scan clock signal and outputs the acquired data to the examination device through the scan-out terminal 7. The examination device compares the data input from the scan-out terminal 7 with an expectation value and determines whether or not failure has occurred to the semiconductor device 1.

Figure 2:
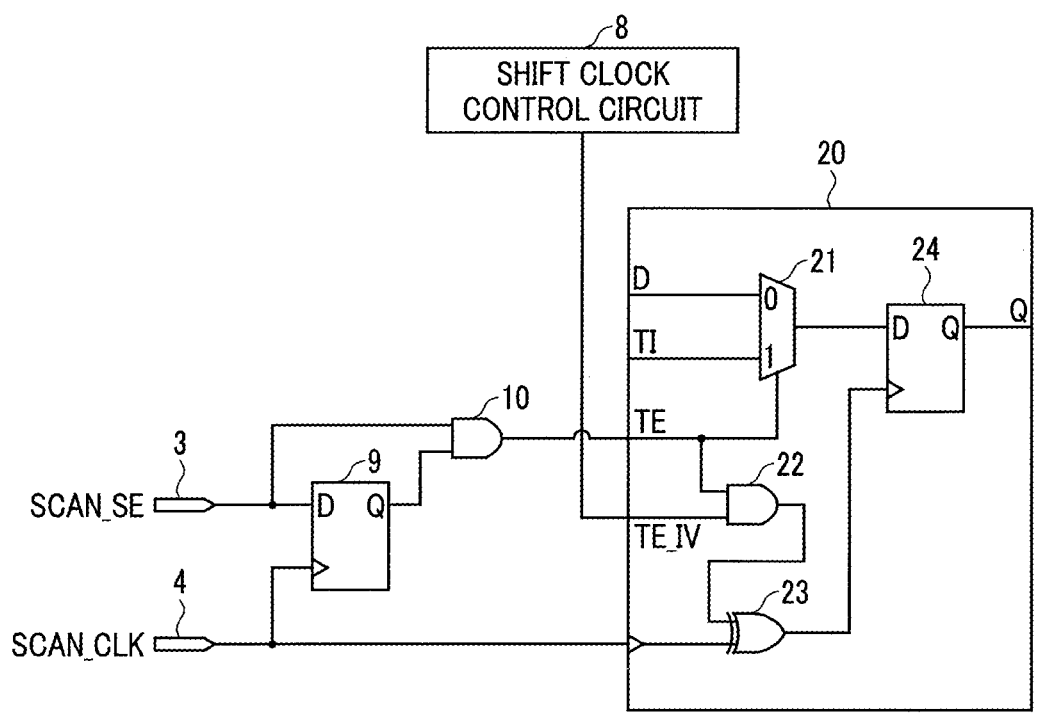
FIG. 2 is a circuit diagram illustrating an example of a circuit configuration of a scan FF.

FIG. 2 is a circuit diagram illustrating an example of a circuit configuration of each scan FF.

As illustrated in FIG. 2, each scan FF 20 includes a selector 21, an AND circuit 22, an XOR circuit 23, and an FF 24.

For example, normal data from a combination circuit is input to one of terminals of the selector 21, and scan test data from the decompressor 11 or a scan FF 20 at a previous stage is input to the other terminal. The selector 21 outputs one of the pieces of data to the FF 24 based on the test enable signal from the AND circuit 10. Specifically, the selector 21 outputs the normal data to the FF 24 when the test enable signal is at L level, or outputs the scan test data to the FF 24 when the test enable signal is at H level.

The AND circuit 22 calculates AND (logical conjunction) of the control signal from the shift clock control circuit 8 and the test enable signal from the AND circuit 10 and outputs a result of the calculation to the XOR circuit 23. The test enable signal is at H level during execution of a scan test. Thus, an L-level signal is output from the AND circuit 22 to the XOR circuit 23 when the control signal from the shift clock control circuit 8 is at L level, or an H-level signal is output from the AND circuit 22 to the XOR circuit 23 when the control signal from the shift clock control circuit 8 is at H level.

The output signal from the AND circuit 22 is input to one of terminals of the XOR circuit 23, and the scan clock signal from the scan clock terminal 4 is input to the other terminal. The XOR circuit 23 calculates XOR (exclusive disjunction) of the output signal from the AND circuit 22 and the scan clock signal from the scan clock terminal 4 and outputs a scan shift clock signal (non-inverted scan clock signal or inverted scan clock signal) as a result of the calculation to the FF 24.

Specifically, when the output signal from the AND circuit 22 is at H level, the XOR circuit 23 outputs, to the FF 24, an inverted scan clock signal obtained by inverting the scan clock signal. When the output signal from the AND circuit 22 is at L level, the XOR circuit 23 intactly outputs the scan clock signal, namely, outputs a non-inverted scan clock signal to the FF 24.

In this manner, a shift clock generation circuit configured to generate a scan shift clock signal is constituted by the AND circuit 22 and the XOR circuit 23, the AND circuit 22 being configured to perform AND calculation of the control signal and the test enable signal, the XOR circuit 23 being configured to perform XOR calculation of the output signal from the AND circuit 22 and the scan clock signal.

The FF 24 acquires the scan test data at every rising edge of the non-inverted scan clock signal or inverted scan clock signal from the XOR circuit 23 and outputs the acquired scan test data to a scan FF 20 at a next stage.

Figure 3:
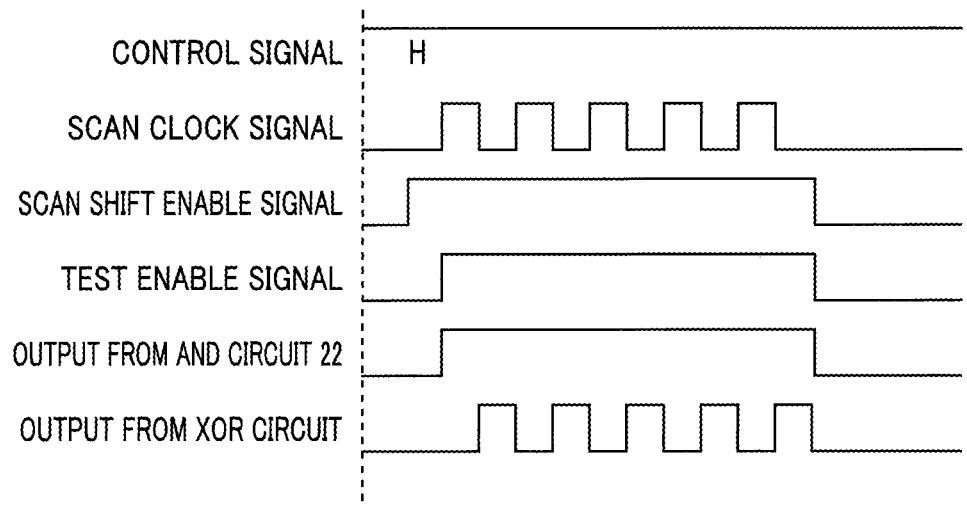
FIG. 3 is a waveform diagram illustrating an operation waveform of the scan FF when a control signal is at H level.
Figure 4:
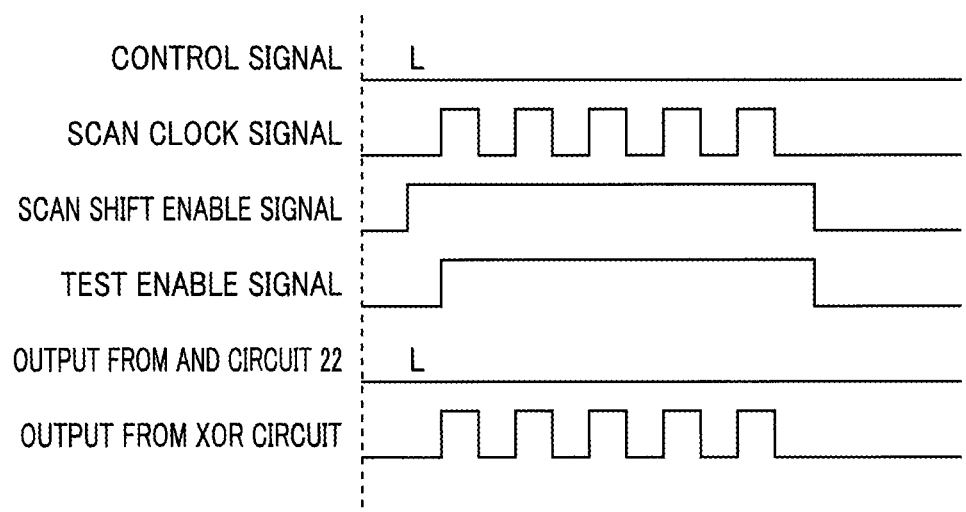
FIG. 4 is a waveform diagram illustrating an operation waveform of the scan FF when the control signal is at L level.

FIG. 3 is a waveform diagram illustrating an operation waveform of each scan FF when the control signal is at H level, and FIG. 4 is a waveform diagram illustrating an operation waveform of each scan FF when the control signal is at L level.

As illustrated in FIG. 3, AND calculation of the control signal and the test enable signal is performed at the AND circuit 22. An H-level signal is output from the AND circuit 22 to the XOR circuit 23 when the control signal is at H level and the test enable signal is at H level.

XOR calculation of the scan clock signal and the output signal from the AND circuit 22 is performed at the XOR circuit 23. Thus, the scan clock signal is inverted and output from the XOR circuit 23 in a duration in which the output signal from the AND circuit 22 is at H level.

As illustrated in FIG. 4, an L-level signal is output from the AND circuit 22 to the XOR circuit 23 even when the test enable signal is at H level while the control signal is at L level.

XOR calculation of the scan clock signal and the output signal from the AND circuit 22 is performed at the XOR circuit 23, and the scan clock signal is intactly output from the XOR circuit 23.

In this manner, each scan FF 20 generates the non-inverted scan clock signal or the inverted scan clock signal in accordance with the control signal from the shift clock control circuit 8. Then, the scan FF 20 performs scan shift operation in accordance with the generated non-inverted scan clock signal or inverted scan clock signal.

The shift clock control circuit 8 individually outputs the control signal to the scan chains SC1 to SCm. For example, the shift clock control circuit 8 outputs the control signal at L level to the scan chain SC1, and outputs the control signal at H level to the scan chain SC2.

In this case, each scan FF 20 of the scan chain SC1 performs scan shift operation in accordance with the non-inverted scan clock signal, and each scan FF 20 of the scan chain SC2 performs scan shift operation in accordance with the inverted scan clock signal.

More specifically, the shift clock control circuit 8 generates the control signal and outputs the generated control signal to the plurality of scan chains SC so that a ratio of scan chains SC that perform shift operation in accordance with the non-inverted scan clock signal among the plurality of scan chains SC is substantially equal to a ratio of scan chains SC that perform shift operation in accordance with the inverted scan clock signal among the plurality of scan chains SC.

When the plurality of scan chains SC each include a different number of scan FFs 20, the shift clock control circuit 8 generates the control signal and outputs the generated control signal to the plurality of scan chains SC so that a ratio of scan FFs 20 that perform shift operation in accordance with the non-inverted scan clock signal among the plurality of scan FFs 20 is substantially equal to a ratio of scan FFs 20 that perform shift operation in accordance with the inverted scan clock signal among the plurality of scan FFs 20.

Accordingly, the semiconductor device 1 of the present embodiment controls a ratio of simultaneously switched scan FFs 20.

Subsequently, a process of examination of the semiconductor device 1 thus configured will be described below. FIG. 5 is a flowchart illustrating an example of the process of the semiconductor device examination.

First, the shift clock control circuit 8 outputs, to each of the plurality of scan chains SC, a control signal that non-inverts or inverts a scan clock signal (S1). Subsequently, each scan FF 20 generates a non-inverted scan clock signal or an inverted scan clock signal based on the control signal, the non-inverted scan clock signal being obtained by non-inverting the scan clock signal, the inverted scan clock signal being obtained by inverting the scan clock signal (S2). Lastly, the scan FF 20 performs scan shift operation in accordance with the non-inverted scan clock signal or the inverted scan clock signal (S3), and ends processing.

As a result of the above-described processing, scan shift operation can be performed for each scan chain SC in accordance with the non-inverted scan clock signal or the inverted scan clock signal.

FIG. 6 is a waveform diagram illustrating a waveform of switching noise when all scan FFs are simultaneously switched, and FIG. 7 is a waveform diagram illustrating a waveform of switching noise when a ratio of simultaneously switched scan FFs is controlled.

As illustrated in FIG. 6, when the control signal at L level is input to the scan chains SC1 to SCm, non-inverted scan clock signals are generated at all scan FFs 20 of the scan chains SC1 to SCm.

Thus, the FFs 24 of all scan FFs 20 of the scan chains SC1 to SCm are switched at every rising edge of the scan clock signal. As a result, switching noise having a large peak at every rising edge of the scan clock signal is generated.

As illustrated in FIG. 7, when the control signal at L level and the control signal at H level are alternately input to the scan chains SC1 to SCm, non-inverted scan clock signals are generated at the scan FFs 20 of the scan chains SC1, SC3, . . . to which the control signal at L level is input, and inverted scan clock signals are generated at the scan FFs 20 of the scan chains SC2, SC4, . . . to which the control signal at H level is input.

Thus, the FFs 24 of the scan FFs 20 of the scan chains SC1, SC3, . . . are switched at every rising edge of the scan clock signal. The FFs 24 of the scan FFs 20 of the scan chains SC2, SC4, . . . are switched at every falling edge of the scan clock signal. As a result, switching noise generation is dispersed to the rising edge and falling edge of the scan clock signal, and switching noise having a peak smaller than the peak in FIG. 6 is generated.

As described above, each scan FF 20 has a function to non-invert/invert the scan clock signal in accordance with the control signal when the test enable signal is at H level. The shift clock control circuit 8 can control the control signal for each scan chain SC. For example, the shift clock control circuit 8 outputs the control signal at H level to the scan chains SC1, SC3, . . . and outputs the control signal at L level to the scan chains SC2, SC4, . . . .

Influence of switching noise can be dispersed to every rising edge and falling edge of the scan clock signal by controlling, with the shift clock control circuit 8, a ratio of scan FFs 20 that operate in accordance with a non-inverted/inverted scan clock signal, in other words, by controlling the number of simultaneously switched scan FFs 20. Accordingly, without increasing the number of scan patterns, it is possible to lower a switching noise peak generated due to simultaneous switching, thereby stably executing a scan test.

Thus, according to the semiconductor device 1 of the present embodiment, it is possible to reduce influence of switching noise without increase in a test time period.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a plurality of scan chains each including a plurality of scan flip-flops;
a shift clock control circuit configured to output, to each of the plurality of scan chains, a control signal that non-inverts or inverts a scan clock signal; and
a shift clock generation circuit provided to each of the plurality of scan flip-flops and configured to generate a non-inverted scan clock signal or an inverted scan clock signal based on the control signal, the non-inverted scan clock signal being obtained by non-inverting the scan clock signal, the inverted scan clock signal being obtained by inverting the scan clock signal.

2. The semiconductor device according to claim 1, wherein the shift clock control circuit is configured to generate the control signal so that a ratio of scan chains that perform shift operation in accordance with the non-inverted scan clock signal among the plurality of scan chains is substantially equal to a ratio of scan chains that perform shift operation in accordance with the inverted scan clock signal among the plurality of scan chains.

3. The semiconductor device according to claim 1, wherein the shift clock control circuit is configured to generate the control signal so that a ratio of scan flip-flops that perform shift operation in accordance with the non-inverted scan clock signal among the plurality of scan flip-flops is substantially equal to a ratio of scan flip-flops that perform shift operation in accordance with the inverted scan clock signal among the plurality of scan flip-flops.

4. The semiconductor device according to claim 1, wherein the shift clock generation circuit includes a logical conjunction circuit configured to calculate logical conjunction of the control signal and a test enable signal and an exclusive disjunction circuit configured to calculate exclusive disjunction of an output signal from the logical conjunction circuit and the scan clock signal.

5. A semiconductor device examination method of examining a semiconductor device including a plurality of scan chains each including a plurality of scan flip-flops, the method comprising:
outputting, to each of the plurality of scan chains, a control signal that non-inverts or inverts a scan clock signal;
generating a non-inverted scan clock signal or an inverted scan clock signal based on the control signal, the non-inverted scan clock signal being obtained by non-inverting the scan clock signal, the inverted scan clock signal being obtained by inverting the scan clock signal; and
performing scan shift operation in accordance with the non-inverted scan clock signal or the inverted scan clock signal.

6. The semiconductor device examination method according to claim 5, further comprising:
generating the control signal so that a ratio of scan chains that perform shift operation in accordance with the non-inverted scan clock signal among the plurality of scan chains is substantially equal to a ratio of scan chains that perform shift operation in accordance with the inverted scan clock signal among the plurality of scan chains.

7. The semiconductor device examination method according to claim 5, further comprising:
generating the control signal so that a ratio of scan flip-flops that perform shift operation in accordance with the non-inverted scan clock signal among the plurality of scan flip-flops is substantially equal to a ratio of scan flip-flops that perform shift operation in accordance with the inverted scan clock signal among the plurality of scan flip-flops.

* * * * *